(12) United States Patent
Shinozaki

(10) Patent No.: US 6,584,027 B2
(45) Date of Patent: Jun. 24, 2003

(54) SEMICONDUCTOR MEMORY

(75) Inventor: Naoharu Shinozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/085,026

(22) Filed: Mar. 1, 2002

(65) Prior Publication Data
US 2003/0026151 A1 Feb. 6, 2003

(30) Foreign Application Priority Data
Aug. 6, 2001 (JP) ........................................ 2001-238136

(51) Int. Cl.$^7$ ................................................. G11C 7/00
(52) U.S. Cl. ..................... 365/205; 365/230.03; 365/51
(58) Field of Search ............................ 365/205, 230.03, 365/51, 63

(56) References Cited

U.S. PATENT DOCUMENTS 5,426,603 A * 6/1995 Nakamura et al. .......... 365/205
5,848,011 A * 12/1998 Muraoka et al. ............ 365/207

* cited by examiner

Primary Examiner—Huan Hoang
(74) Attorney, Agent, or Firm—Arent Fox Kintner Plotkin & Kahn, PLLC

(57) ABSTRACT

Latches for amplifying data on bit lines are activated in response to the activation of first activating signals. Amplifying transistors to be operated in read operations and switching transistors to be operated in write operations receive the activation of second activating signals at their sources and are activated per sense amplifier array. Since the numbers of amplifying transistors and switching transistors to be operated decrease, power consumption during operation period is reduced. Besides, since the wiring lengths of second activating signal lines can be made small compared to conventional art, driving capacity of second sense amplifier control circuits can be reduced. As a result, power consumption of the sense amplifiers can be reduced significantly in read operations. By having smaller loads in the second activating signal lines, transmission time of the second activating signals can be shortened, and thus read operation time and write operation time can be reduced.

19 Claims, 8 Drawing Sheets

SEMICONDUCTOR MEMORY

BACKGROUND OF THE INVENTION

1. Field of the Invention

The present invention relates to a semiconductor memory having sense amplifiers.

2. Description of the Related Art

FIG. 1 shows a conventional DRAM memory core. The memory core is provided with four memory blocks BLK0–3. Each memory block BLK has two memory cell arrays ALY and a sense amplifier array RSA (RSA0–3) to be shared between these memory cell arrays ALY. The sense amplifier array RSA consists of, for example, 1024 sense amplifiers (not shown) which are arranged in the horizontal direction of the diagram.

The memory cell arrays ALY have a plurality of memory cells MC to be selected by word lines WL and bit lines BL (or /BL). The sense amplifier arrays RSA each have signal lines of first activating signals PSA (PSA0–3) and NSA (NSA0–3), a second activating signal /RCL (/RCL0–3), and a third activating signal WCL (WCL0–3) which are laid in the horizontal direction of the diagram. In the following description, the symbols of the signals (such as PSA, NSA, /RCL, and WCL) will be also used as symbols for the signal lines that transmit the respective signals.

The memory core also includes first sense amplifier control circuits C1 (C1-0, C1-1, C1-2, C1-3) and second sense amplifier control circuits C2 (C2-0, C2-1, C2-2, C2-3) corresponding to the respective sense amplifier arrays RSA, row decoders RDEC corresponding to the respective memory cell arrays ALY, and a column decoder CDEC.

The first sense amplifier control circuits C1 activate the first activating signals PSA (PSA0–3) and NSA (NSA0–3) in accordance with an upper row address R1, R0. The activation of the first activating signals PSA and NSA activates latches (to be described later) of all the sense amplifiers in the corresponding sense amplifier arrays RSA. The second sense amplifier control circuits C2 activate the second activating signals /RCL and the third activating signals WCL in accordance with the upper row address R1, R0.

The row decoders RDEC operate in accordance with a 3-bit row address RADD including the upper row address R1, R0, and select the word lines WL in accordance with a lower row address RADD. The column decoder CDEC activates column selecting signals CL (CL0, 1, . . . ) in accordance with a column address CADD. The column selecting signals CL are signals common to the four memory blocks BLK0–3. The activation of the column selecting signals CL turns on predetermined column switches (to be described later) of sense amplifier arrays RSA that are activated by the first activating signals PSA and NSA. That is, the sense amplifiers are selected in accordance with the column selecting signals CL.

FIG. 2 shows the details of the sense amplifier array RSA0 of FIG. 1. The sense amplifier arrays RSA1–3 have the same structure as that of the sense amplifier array RSA0. FIG. 2 is rotated 90° relative to FIG. 1.

The sense amplifier array RSA0 has a plurality of sense amplifiers SA corresponding to the respective bit line pairs BL, /BL. Isolation gates for isolating the sense amplifiers SA from the memory cell arrays ALY are formed on both sides of the sense amplifiers SA (right and left in the diagram). The isolation gates are controlled by bit line selecting signals /SBTL and /SBTR, respectively. That is, the sense amplifier array RSA0 is shared between the memory cell arrays ALY on both sides by means of the bit line selecting signals /SBTL and /SBTR.

Each sense amplifier includes a latch 2, a read control circuit 4, and a write control circuit 6. The latch 2 is composed of two CMOS inverters having inputs and outputs connected to each other. When the first activating signals PSA0 and NSA0 are activated (high level and low level, respectively), the latch 2 is activated to amplify data on the bit line BL (or /BL) and latch the data amplified. The first activating signal lines PSA0 and NSA0 are laid common to all the sense amplifiers SA in the sense amplifier array RSA0. On this account, the first activating signal lines PSA0 and NSA0 have a great wiring length and high load capacitance. In read operations and write operations, the activation of the first activating signals PSA0 and NSA0 activates all the latches 2 in the sense amplifier array RSA0 simultaneously.

The read control circuit 4 has an amplifying transistor 4a and a switching transistor 4b (column switch) for each bit line BL, /BL. Each amplifying transistor 4a is connected at its gate to the bit line BL (or /BL) and at its source to the second activating signal line /RCL0. Each switching transistor 4b is connected at its source to the drain of an amplifying transistor 4a, at its gate to the column selecting signal line CL, and at its drain to a read data bus line RDB0 (or /RDB0). The second activating signal line /RCL0 is laid common to the amplifying transistors 4a of all the sense amplifiers SA in the sense amplifier array RSA0. On this account, the second activating signal line /RCL0 has a great wiring length and high load capacitance.

The amplifying transistors 4a have the function of amplifying read data received at their gates and outputting the resultant to their drains. Such a circuit system of sense amplifiers in which the gates are connected to bit lines is generally referred to as direct sense system. In the direct sense system, the bit lines BL and /BL are not directly connected to the read data bus lines RDB0 and /RDB0. Therefore, even if the column selecting signal CL is activated before data read from the memory cells MC is amplified completely, the read operation will be performed properly without corruption of data on the bit lines BL and /BL. That is, it is suited to high-speed operation.

The write control circuit 6 has two switching transistors 6a and 6b in series for each bit line BL, /BL. Each switching transistor 6a is connected at one end to a write data bus line WDB0 (or /WDB). Each switching transistor 6b (column switch) is connected at one end to the bit line BL (or /BL). The two gates of the switching transistors 6a and 6b are connected to the third activating signal line WCL0 and the column selecting signal line CL (CL0–1), respectively. The third activating signal line WCL0 is laid common to the switching transistors 6a of all the sense amplifiers SA in the sense amplifier array RSA0. On this account, the third activating signal line WCL0 has a great wiring length and high load capacitance.

FIG. 3 shows the operations of the DRAM described above. In this example, the DRAM receives an active command ACTV from the exterior when in a standby state STBY, and then receives a read command READ and a write command WRITE to perform a read operation and a write operation in succession. After the write operation, the DRAM also receives a precharging command PRE from the exterior and precharges (equalizes) bit line pairs BL, /BL.

Initially, the active command ACTV and a row address RADD are supplied. A bit line resetting signal /BRS of the memory block BLK corresponding to the row address RADD turns to low level, releasing the precharge of the bit line pairs BL, /BL (FIG. 3(a)). The row decoder RDEC of FIG. 1 activates a word line WL in accordance with the row address RADD (FIG. 3(b)). Due to the activation of the word line WL, data is read from the memory cells MC to the bit lines BL (or /BL) (FIG. 3(c)).

Next, the first sense amplifier control circuit C1 corresponding to the row address RADD activates the first activating signals PSA and NSA (FIG. 3(d)). The first activating signal lines PSA and NSA are connected to the latches of all the sense amplifiers SA in the memory block BLK. Therefore, due to the activation of the first activating signal lines PSA and NSA, all the latches 2 in the memory block BLK start an amplifying operation, amplifying the voltage differences between the bit lines BL and /BL (FIG. 3(e)). All the latches 2 in the memory block BLK also latch the data amplified.

Now, the second sense amplifier control circuit C2 corresponding to the row address RADD activates the second activating signal /RCL and the third activating signal WCL (FIG. 3(f)). The activation of the second activating signal line /RCL supplies a source voltage to the amplifying transistors 4a in the read control circuits 4 of FIG. 2, so that the amplifying transistors 4a start operating. The activation of the third activating signal WCL turns on the switching transistors 6a in the write control circuits 6 of FIG. 2. Here, since no column selecting signal CL is activated yet, the bit lines BL and /BL are not connected to the write data bus lines WDB and /WDB.

As shown in FIG. 1, the second activating signal line /RCL and the third activating signal line WCL are shared among all the sense amplifiers SA in the memory block BLK, and thus are great in wiring length and high in loads such as wiring capacitance. As a result, the second activating signal line /RCL and the third activating signal line WCL dull in waveform and become longer in transmission time. For this reason, the second activating signal /RCL and the third activating signal WCL are activated without waiting for the read command READ or the write command WRITE. For example, if the second activating signal /RCL were changed after the reception of the read command READ, the read control circuits 4 might be late in starting operation with a longer read cycle. The same holds true for the write control circuits 6.

After the data on the bit lines BL (or /BL) is amplified, the read command READ and a column address CADD are supplied. The column decoder CDEC of FIG. 1 activates any one of the column selecting signals CL in accordance with the column address CADD (FIG. 3(g)). The activation of the column selecting signal CL turns on the switching transistors 4b of FIG. 2, whereby the complementary read data amplified by the amplifying transistors 4a is transmitted to the read data bus lines RDB and /RDB. Subsequently, an amplifier AMP of FIG. 1 amplifies and outputs the read data to the exterior.

Next, the write command WRITE, a column address CADD, and write data are supplied. Here, the word line WL and the sense amplifiers SA are kept activated. The write data is amplified by the amplifier AMP of FIG. 1 and transmitted as complementary write data to the write data bus WDB, /WDB. The column decoder CDEC activates any one of the column selecting signals CL in accordance with the column address CADD (FIG. 3(h)). The activation of the column selecting signal CL turns on the switching transistors 6b in the write control circuit 6 of FIG. 2, thereby connecting the write data bus lines WDB, /WDB and the bit lines BL, /BL, respectively. The write data is transmitted to the bit lines BL and /BL and written to memory cells MC (FIG. 3(i)).

Then, the precharging command PRE is supplied. The precharging command PRE inactivates the word line WL, the first activating signals PSA and NSA, the second activating signal /RCL, and the third activating signal WCL (FIGS. 3(j), (k), (l)). In addition, the bit line resetting signal /BRS is activated (FIG. 3(m)) and the bit line pairs BL, /BL are precharged (FIG. 3(n)).

In the conventional direct sense system, the second and third activating signal lines /RCL and WCL were connected to all the sense amplifiers SA in the sense amplifier arrays RSA as described above, with great wiring lengths and high load capacitance. Therefore, to obtain desired read cycle time and write cycle time, the second sense amplifier control circuits C2 had to start operation in synchronization with the active command ACTV. More specifically, the amplifying transistors 4a of the read control circuits 4 and the switching transistors 6a of the write control circuits 6 had to be operated before the supply of the read command READ and the write command WRITE. This consequently required, for example, that the write control circuits 6 be operated even in read operations. The operation of circuits extraneous to original operation consumed extra power.

Moreover, the read control circuits 4 and the write control circuits 6 required high driving capacity since they needed to drive the second and third activating signal lines /RCL and WCL which were great in wiring length and high in loads. This meant a problem of greater power consumption in read operations and write operations. Furthermore, there has been a problem of high peak current due to the simultaneous operation of the read control circuits 4 and the write control circuits 6 which required high driving capacity.

SUMMARY OF THE INVENTION

An object of the present invention is to reduce power consumption of a semiconductor memory. In particular, the reduction of power consumption is intended for a semiconductor memory that has sense amplifiers of a direct sense system.

Another object of the present invention is to perform read operations and write operations of a semiconductor memory at high speed.

According to one of the aspects of the semiconductor memory of the present invention, a memory cell array has a plurality of memory cells and a plurality of bit lines for transmitting data to these memory cells, respectively. A plurality of sense amplifiers is formed corresponding to the bit lines, respectively. The sense amplifiers each include a latch, an amplifying transistor, and a column switch. The sense amplifier arrays are formed corresponding to the memory cell array. Predetermined numbers of sense amplifiers make a plurality of sense amplifier arrays.

The latch amplifies and holds data on a bit line in response to the activation of a first activating signal. The amplifying transistor amplifies a voltage level of the bit line received at a gate of the amplifying transistor upon receiving the activation of a second activating signal at a source of the amplifying transistor. The column switch connects the drain of the amplifying transistor to a read data bus line in response to the activation of a column selecting signal.

A first sense amplifier control circuit generates the first activating signal. The first activating signal is supplied to all the sense amplifiers simultaneously. That is, the latches of all the sense amplifiers are simultaneously activated to amplify the data on the bit lines. A plurality of second sense amplifier control circuits generates the second activating signals having different activating timings from each other, respectively. The second activating signals are supplied to different sense amplifiers, respectively. That is, the amplifying transistors of the sense amplifiers are activated in units of sense amplifier arrays. In other words, the number of sense amplifier arrays and the number of amplifying transistors to be operated at a time are set in accordance with the number of signal lines of second activating signals.

Since the number of amplifying transistors to be operated decreases, power consumption is reduced in read operations. In addition, because the amplifying transistors are activated in units of sense amplifier arrays in response to the plurality of second activating signals, the wiring length of signal lines for transmitting the second activating signals can be made shorter than the wiring length in conventional art. The signal lines become smaller in loads such as load capacitance and wiring resistance. Therefore, buffer circuits of the second sense amplifier control circuits that generate the second activating signals can be lowered in driving capacity. As a result, power consumption of the sense amplifiers can be reduced significantly in read operations.

Having smaller loads in the aforementioned signal lines can decrease the transmission time of the second activating signals, with a reduction in read operation time. As stated above, all the latches are simultaneously activated to amplify the data on the bit lines. That is, it is possible for each of the sense amplifiers to have the data read from the memory cells amplified by their respective latches in advance. Therefore, a large amount of data can be consecutively output to the exterior at high speed by simply activating the second activating signals in succession.

According to another aspect of the semiconductor memory of the present invention, word lines control connection between storage nodes of the memory cells and the bit lines. An address input circuit receives a row address for selecting one of the word lines and a column address for selecting one of the column switches. The first sense amplifier control circuit activates the first activating signal in accordance with the row address. The second sense amplifier control circuits activate the second activating signals in accordance with the row address and the column address, respectively. Here, the row address and the column address may be supplied from the exterior in time division or simultaneously.

As described above, the number of sense amplifier arrays which operate simultaneously is set in accordance with the number of second activating signals. Since the sense amplifiers are respectively connected to the bit lines, the sense amplifier arrays are lined in the direction orthogonal to the direction that the bit lines are lined (the direction the sense amplifiers are lined in). Therefore, when the logic of the column address is included in the second activating signals, the predetermined number of sense amplifiers connected to the bit lines of the memory cell array can be easily divided into a plurality of sense amplifier arrays. On the contrary, when the plurality of second activating signals are generated from the row address alone, the sense amplifier arrays should be lined in the direction orthogonal to the direction that the word lines are lined. However, making such division is impossible since the sense amplifiers are lined along the direction the word lines run.

According to another aspect of the semiconductor memory of the present invention, a plurality of memory blocks to be selected in accordance with the row address, respectively, are formed. The memory blocks each have the memory cell array and a plurality of the sense amplifier arrays arranged in a first direction along the memory cell array. Even when the plurality of memory blocks is formed, power consumption of the sense amplifiers can be reduced significantly in read operations as described above.

According to another aspect of the semiconductor memory of the present invention, the memory blocks are arranged in a second direction orthogonal to the first direction. The first sense amplifier control circuit is arranged at one end of each of the respective memory blocks along the second direction. The second sense amplifier control circuits are arranged outside the memory blocks corresponding to the sense amplifier arrays along the first direction.

Since the direction the second sense amplifier control circuits are arranged in and the direction the sense amplifier arrays are arranged in are both the same first direction, the signal lines of the second activating signals can be minimized in wiring length. Besides, for all the sense amplifier arrays, the second activating signal lines can be made equal in wiring lengths. This allows a further reduction in the transmission time of the second activating signals.

According to another aspect of the semiconductor memory of the present invention, second activating signal lines for transmitting the second activating signals to the sense amplifiers are laid in a first wiring layer, in which signal lines of the column selecting signals are laid. For transmitting the column selecting signals in a small amount of time, the signal lines for transmitting the column selecting signals are typically laid in a wiring layer of low resistance. For this reason, the transmission time of the second activating signals can be further reduced.

According to another aspect of the semiconductor memory of the present invention, the sense amplifier arrays are arranged in the first direction along the memory cell array. The second activating signal lines for transmitting the second activating signals to the sense amplifiers are laid in the second direction in the first wiring layer, in which signal lines of the column selecting signals are laid, the second activating signal lines are laid as far as the sense amplifier arrays. Moreover, within the sense amplifier arrays, the second activating signal lines are laid in the first direction in a second wiring layer, in which the first activating signal line(s) for transmitting the first activating signal(s) are laid. Since the relatively long wiring up to the sense amplifier arrays is formed in the first wiring layer of low resistance, it is possible to lower the total wiring resistance of the second activating signal lines. This allows reduction in the transmission time of the second activating signals.

According to another aspect of the semiconductor memory of the present invention, a plurality of third sense amplifier control circuits generates third activating signals having different activating timings from each other, respectively. The sense amplifiers each include a switch and a column switch. The switch turns on in response to any one of the third activating signals to transmit the data on the bit line. The column switch connects corresponding one of the bit lines to a write data bus line through the switch in response to the activation of the column selecting signal.

The plurality of third activating signals are supplied to the plurality of sense amplifier arrays, respectively, each includes a predetermined number of sense amplifiers. That is, the switches of the sense amplifiers are activated in units of sense amplifier arrays. Since the number of switches to be operated decreases, power consumption is reduced in write operations. In addition, since the switches are activated in units of sense amplifier arrays in response to the plurality of third activating signals, the wiring length of signal lines for transmitting the third activating signals can be made shorter than the wiring length in conventional art. The signal lines become smaller in loads such as load capacitance and wiring resistance. Therefore, buffer circuits of the third sense amplifier control circuits that generate the third activating signals can be lowered in driving capacity. As a result, power consumption of the sense amplifiers can be reduced significantly in write operations. The shorter transmission time of the third activating signals allows reduction in write operation time.

For example, like the second activating signal lines described above, third activating signal lines for transmitting the third activating signals can be laid in the first wiring layer, in which the signal lines of the column selecting signals are laid, with a further reduction in the transmission time of the third activating signals.

According to another aspect of the semiconductor memory of the present invention, the second sense amplifier control circuits generate the second activating signals in read operations. The third sense amplifier control circuits generate the third activating signals in write operations. Since the read operations and the write operations involve only necessary control circuits, respectively, it is possible to reduce power consumption.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENT

Hereinafter, an embodiment of the present invention will be described with reference to the drawings.

Figure 4:
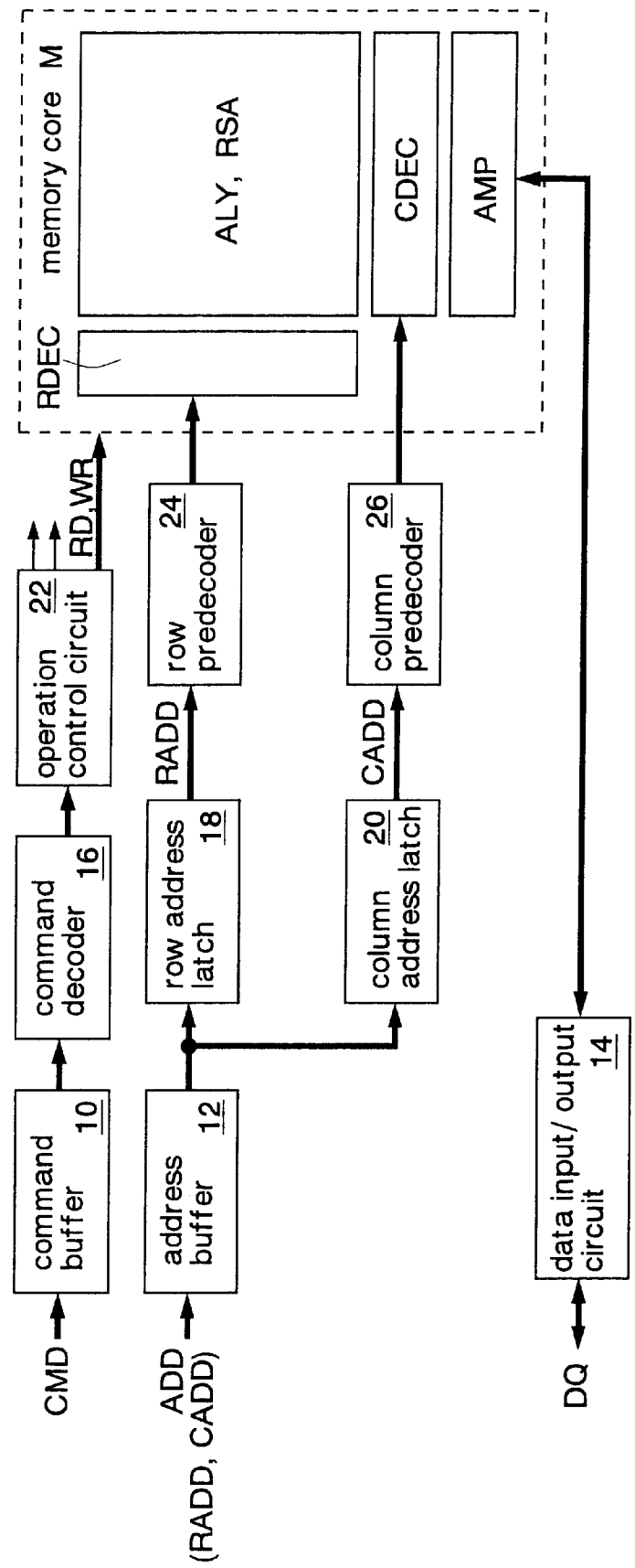
FIG. 4 is a block diagram showing a first embodiment of the present invention.

FIG. 4 shows an embodiment of the semiconductor memory in the present invention. This semiconductor memory is formed on a silicon substrate by using CMOS processes and has a DRAM memory core. In the diagram, each thick line represents a signal line that consists of a plurality of lines. The symbols "/" in front of signal names and signal line names indicate that the signals are of negative logic and that signals of negative logic are transmitted therethrough, respectively.

The semiconductor memory has a command buffer 10, an address buffer 12, a data input/output circuit 14, a command decoder 16, a row address latch 18, a column address latch 20, an operation control circuit 22, a row predecoder 24, a column predecoder 26, and a memory core M. Aside from those shown in the diagram, the semiconductor memory also includes a refresh control circuit for refreshing the memory cells, a mode register for setting an operation mode, and so on.

The command buffer 10 receives a command CMD from the exterior of the memory through command terminals, and outputs the received command CMD to the command decoder 10. The address buffer 12 receives an address ADD from the exterior of the memory through address terminals, and outputs the received address ADD to the row address latch 18 and the column address latch 20. This semiconductor memory employs an address multiplex system, and receives an address ADD necessary for read and write operations as divided into a row address RADD and a column address CADD. The data input/output circuit 14, in read operations, outputs read data from the memory core M to the exterior through data input/output terminals. In write operations, the data input/output circuit 14 outputs write data from the exterior to the memory core M.

The command decoder 16 decodes the command CMD and outputs the decoding result to the operation control circuit 22. The row address latch 18 latches the row address RADD and outputs the latched address to the row predecoder 24. The column address latch 20 latches the column address CADD and outputs the latched address to the column predecoder 26.

The operation control circuit 22 outputs control signals in accordance with the decoding result of the command CMD. The operation control circuit 22 activates a read control signal RD and a write control signal WR when the command CMD is a read command READ and a write command WRITE, respectively. When the command CMD is an active command ACTV or a precharging command PRE, the operation control circuit 22 activates respective control signals.

The row predecoder 24 outputs the decoded signal of the row address RADD to the memory core M. The column predecoder 26 outputs the decoded signal of the column address CADD to the memory core M.

The memory core M has a row decoder RDEC, a column decoder CDEC, an amplifier AMP, a plurality of memory arrays ALY, and a plurality of sense amplifier arrays RSA. The amplifier AMP includes sense buffers for amplifying read data read from the memory cell arrays ALY up to CMOS levels and write amplifiers for outputting write data to the memory cell arrays ALY.

Figure 1:
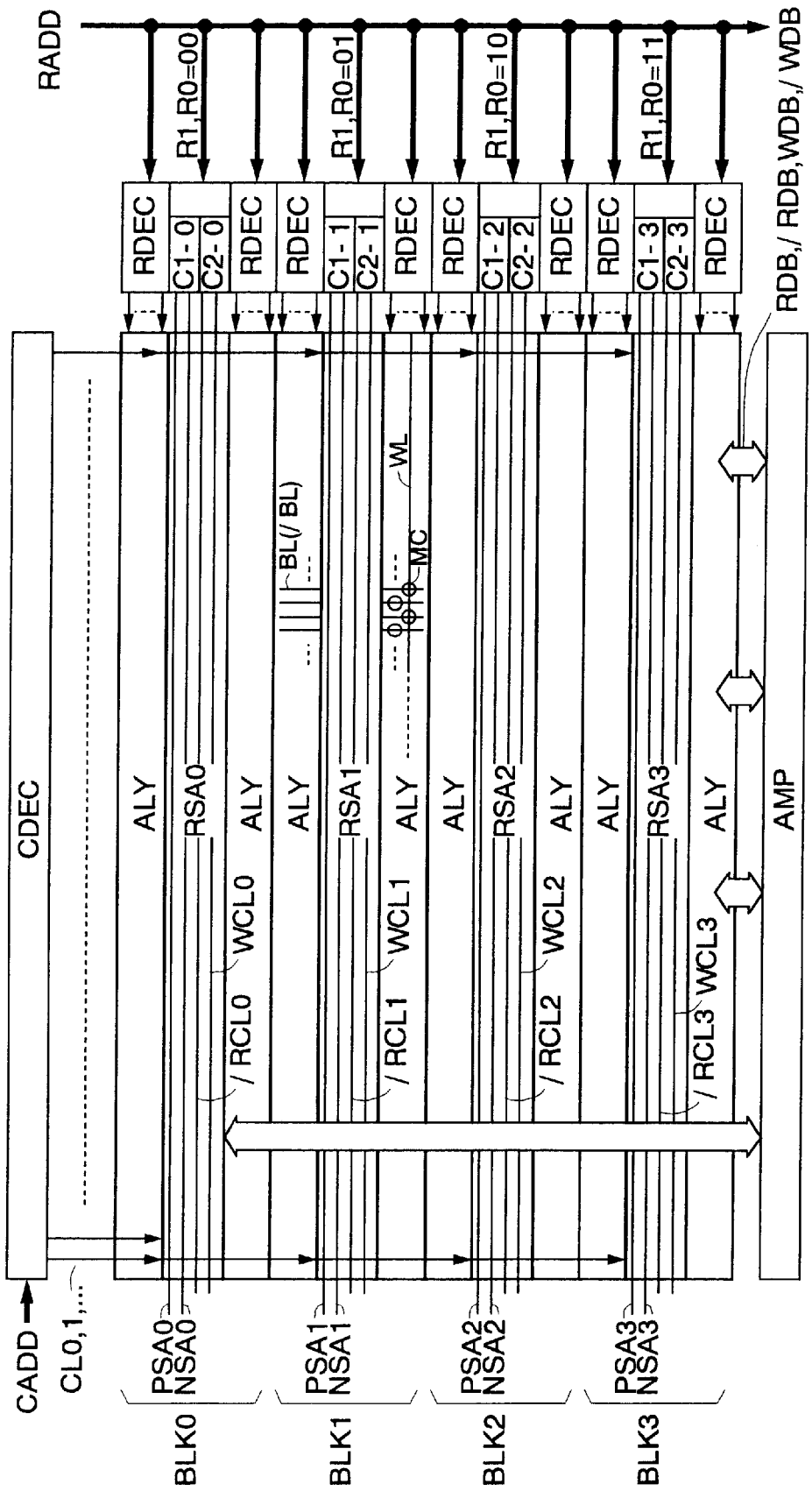
FIG. 1 is a block diagram showing a conventional DRAM memory core.
Figure 5:
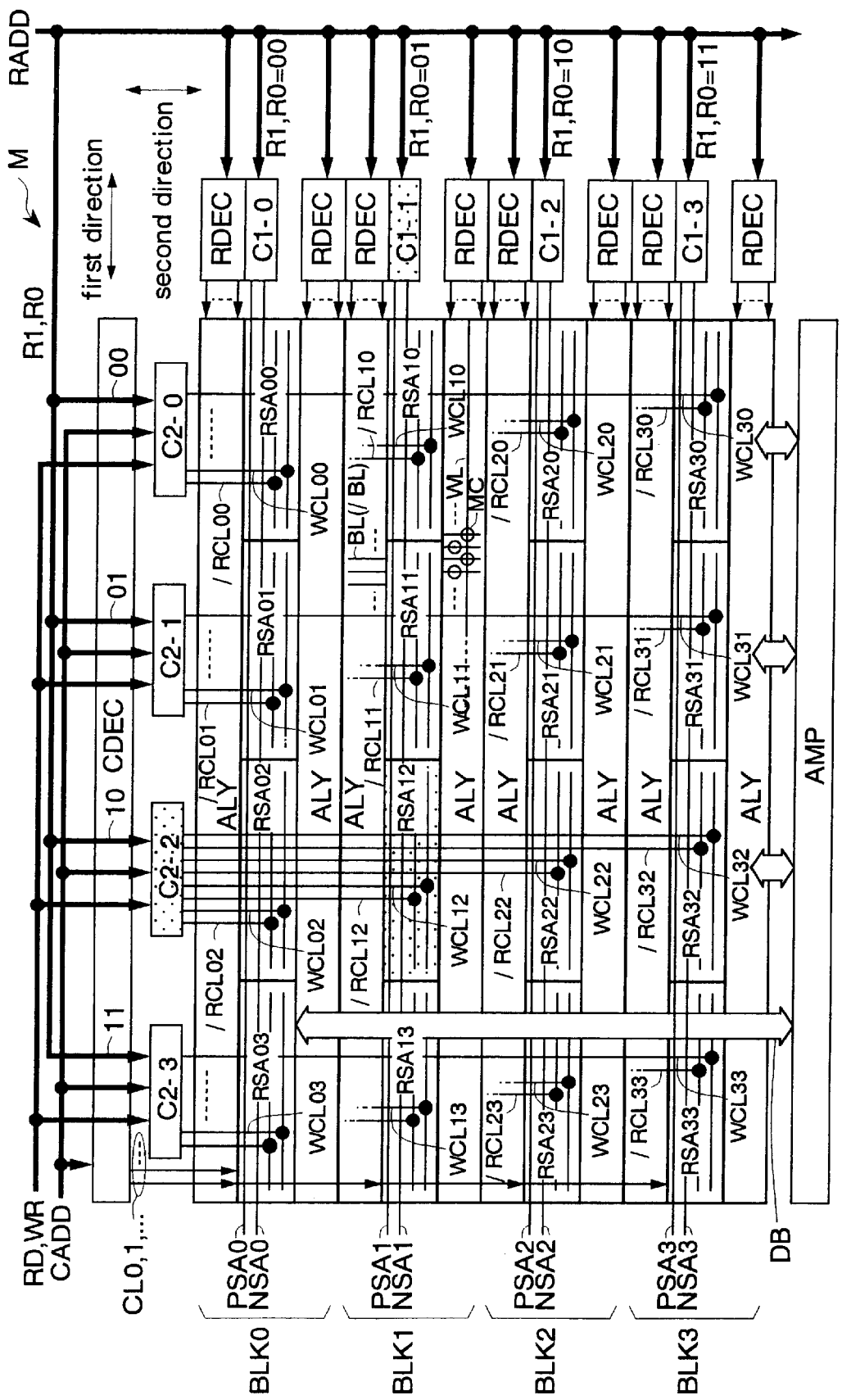
FIG. 5 is a block diagram showing the details of the memory core of FIG. 4.

FIG. 5 shows the details of the memory core M of FIG. 4. The memory cell arrays ALY, the row decoders RDEC, the column decoder CDEC, the amplifier AMP, and the first sense amplifier control circuits C1 have the same configuration as heretofore (FIG. 1). Therefore, detailed description thereof will be omitted here. Incidentally, the present embodiment will deal with the circuits corresponding to a single data input/output terminal. In actual circuitry, the memory cell arrays ALY and the sense amplifier arrays RSA are formed for each of the data input/output terminals.

The four memory blocks BLK0–3 of the memory core M each has two memory cell arrays ALY and a plurality of sense amplifier arrays RSA to be shared between these memory cell arrays ALY. The memory cell arrays ALY have a plurality of memory cells MC to be selected by word lines WL and bit lines BL (or /BL).

In this embodiment, four sense amplifier arrays RSA00–03, 10–13, 20–23, and 30–33 are formed for the respective memory blocks BLK0–3. Each of sense amplifier blocks is formed by the four sense amplifier arrays RSA00–03, 10–13, 20–23, and 30–33. In each memory block BLK, the four sense amplifier arrays RSA are arranged between two memory cell arrays ALY along the horizontal direction (first direction) of the diagram. Each single sense amplifier array RSA consists of 256 sense amplifiers SA (not shown).

The memory core also includes the first sense amplifier control circuits C1 (C1-0, C1-1, C1-2, C1-3), second sense amplifier control circuits C2 (C2-0, C2-1, C2-2, C2-3), eight row decoders RDEC, and the column decoder CDEC.

The first sense amplifier control circuits C1 (C1-0, C1-1, C1-2, C1-3) are formed for the four sense amplifier arrays RSA in the respective memory blocks BLK. The first sense amplifier control circuits C1 are arranged at one end of the rightmost sense amplifier arrays RSA in the diagram (the sense amplifier arrays RSA whose last digits are "0"). The first sense amplifier control circuits C1 activate first activating signals PSA (PSA0–3) and NSA (NSA0–3) in accordance with an upper row address R1, R0. Signal lines that transmit the first activating signals PSA and NSA (first activating signal lines PSA and NSA) are laid common to the four sense amplifier arrays RSA in each memory block BLK. The activation of the first activating signals PSA and NSA activates the latches (the numeral 32 of FIG. 6 to be described later) of all the (1024) sense amplifiers in the four sense amplifier arrays RSA.

The second sense amplifier control circuits C2 (C2-0, C2-1, C2-2, C2-3) are arranged between the topmost memory cell array ALY in the diagram and the column decoder CDEC, along the first direction. The second sense amplifier control circuits C2 are formed at positions corresponding to the four sense amplifier arrays RSA in each memory block, respectively.

The second sense amplifier control circuits C2 activate second activating signals /RCL (/RCL00, 10, 20, 30, /RCL01, 11, 21, 31, /RCL02, 12, 22, 32, /RCL03, 13, 23, 33) and third activating signals WCL (WCL00, 10, 20, 30, WCL01, 11, 21, 31, WCL02, 12, 22, 32, and WCL 03, 13, 23, and 33) in accordance with the upper row address R1, R0 and an upper column address CADD. Here, the last digits of the signals correspond to the numbers of the memory blocks BLK. The second last digits correspond to the last digits of the sense amplifier arrays RSA. That is, the second sense amplifier control circuits C2 generate a second activating signal /RCL and a third activating signal WCL for each sense amplifier array RSA.

The second sense amplifier control circuit C2-3 farthest from the row decoders RDEC is supplied with the row address R1, R0 over the long signal lines, and the propagation time of the row address R1, R0 becomes longer than in the other second sense amplifier control circuits C2-0, C2-1, and C2-2. Nevertheless, as will be described later, the row address R1, R0 is supplied well before the column address CADD. Therefore, the delay in the propagation time has no effect on operating times such as access time.

The row decoders RDEC are arranged on the right of the respective memory cell arrays ALY. The row decoders RDEC operate in accordance with a 3-bit row address RADD including the upper row address R1, R0, and select the word lines WL in accordance with a lower row address RADD.

The column decoder CDEC activates column selecting signals CL (CL0, 1, . . . ) in accordance with the column address CADD. The column selecting signals CL are signals common to the four memory blocks BLK0–4. The activation of the column selecting signals CL turns on predetermined column switches (to be described later) of a sense amplifier array RSA that is activated by the first activating signals PSA and NSA. That is, the sense amplifiers are selected in accordance with the column selecting signals CL.

Signal lines that transmit the second activating signals /RCL (second activating signal lines /RCL) are laid from the second sense amplifier control circuits C2 to the sense amplifier arrays RSA along the second direction in the same first wiring layer as the column selecting signal lines CL are (forth activating signal segment lines). Signal lines that transmit the third activating signals WCL (third activating signal lines WCL) are laid from the second sense amplifier control circuits C2 to the sense amplifier arrays RSA along the second direction in the same first wiring layer as the column selecting signal lines CL are (fifth activating signal segment lines). The second activating signal lines /RCL, within the respective sense amplifier arrays RSA, are laid along the first direction in the same second wiring layer as the first activating signal lines PSA and NSA are (second activating signal segment lines). The third activating signal lines WCL, within the respective sense amplifier arrays RSA, are laid along the first direction in the same second wiring layer as the first activating signal lines PSA and NSA are (third activating signal segment lines).

For high speed transmission of the column selecting signals CL, the column selecting signal lines CL are typically laid in the topmost wiring layer which is low in resistance. Because of being laid in the same direction as that of the column selecting signal lines CL as far as the sense amplifier arrays RSA, the second activating signal lines /RCL and the third activating signal lines WCL can be laid in the same first wiring layer of the lowest resistance as the column selecting signals CL are. Since the relatively long wiring up to the sense amplifier arrays RSA is formed in the first wiring layer of low resistance, it is possible to lower the wiring resistance of the second activating signal lines /RCL and the third activating signal lines WCL.

In each memory block BLK, the second activating signal lines /RCL and the third activating signal lines WCL are laid for the four sense amplifier arrays RSA individually. Therefore, the second activating signal lines /RCL and the third activating signal lines WCL can be reduced in wiring length as compared to the conventional case where they are laid along the first activating signal lines PSA and NSA. As a result, the second activating signals /RCL and the third activating signals WCL can be transmitted to the sense amplifier arrays RSA at high speed. In addition, since the loads of the second activating signal lines /RCL and the third activating signal lines WCL, such as wiring capacitance and wiring resistance, can be made smaller than heretofore, it is possible to lower the driving capacity of the second sense amplifier control circuits C2. This leads to a reduction in power consumption.

Figure 6:
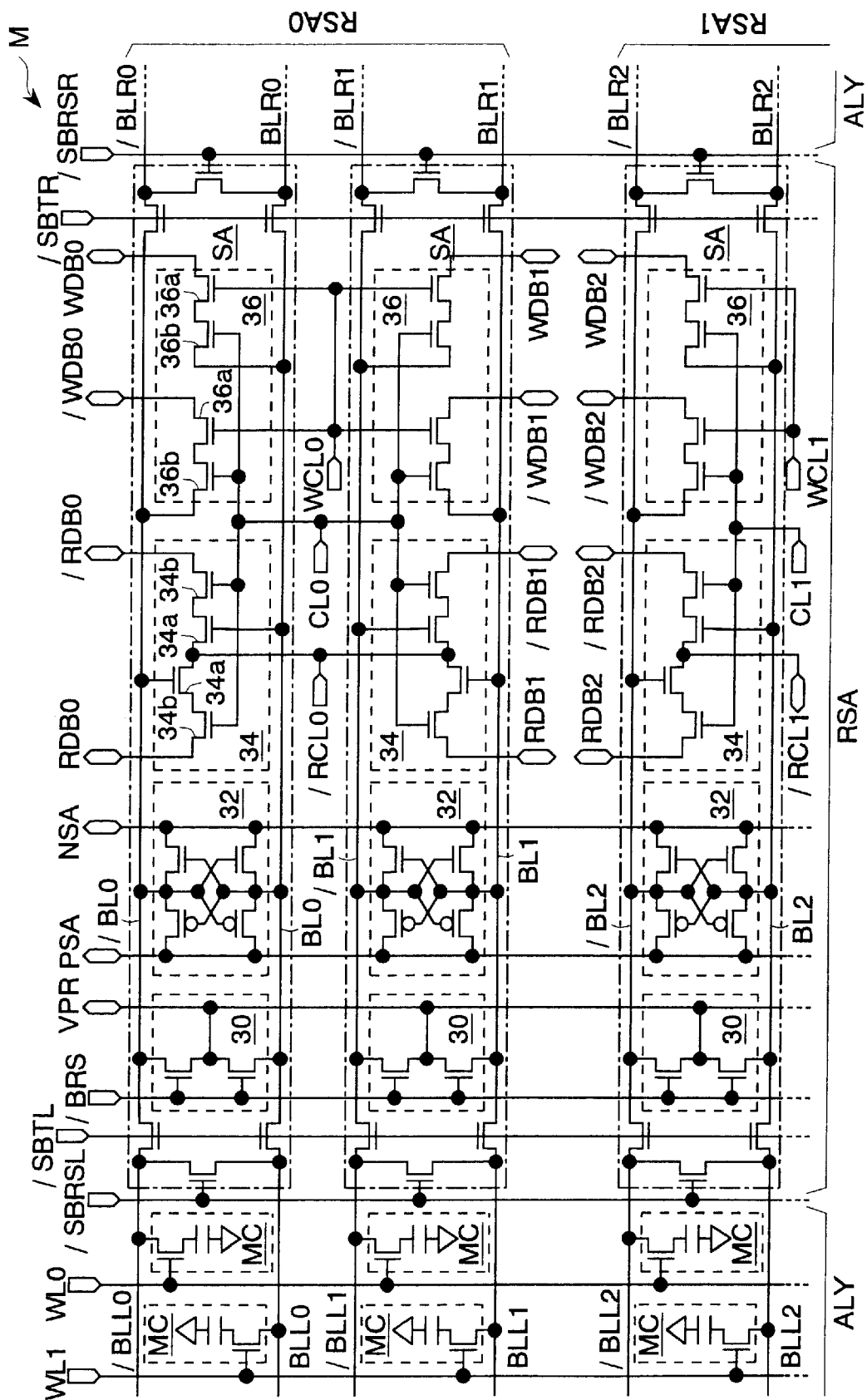
FIG. 6 is a circuit diagram showing the details of the sense amplifier arrays of FIG. 5.

FIG. 6 shows the details of the sense amplifier arrays RSA of FIG. 5. In FIG. 6, the word lines WL (WL0, WL1) are laid in the vertical direction of the diagram, and the bit lines BL (BL0–2, BLL0–2, BLR0–2) and /BL (/BL0–2, /BLL0–2, /BLR0–2) are laid in the horizontal direction of the diagram. That is, FIG. 6 shows a state rotated 90° relative to FIG. 4.

Each of the sense amplifiers SA is connected to bit lines BL and /BL, and includes equalizing MOSs (nMOS transistors) to be controlled by bit line resetting signals /SBRSL and /SBRSR, isolation gates (nMOS transistors) to be controlled by bit line selecting signals /SBTL and /SBTR, a precharging circuit 30, a latch 32 having an amplifying function, a read control circuit 34, and a write control circuit 36. The equalizing MOSs and the isolation gates are arranged close to the memory cell arrays ALY on the right and left in the diagram.

The equalizing MOSs equalize the bit line pairs BLL, /BLL and BLR, /BLR of the memory cell arrays ALY arranged across the sense amplifier SA, respectively. The isolation gates are controlled by the bit line selecting signals /SBTL and /SBTR, and connect the sense amplifier SA with the memory cell arrays ALY on the left and right, both sides in the diagram, respectively. In read operations and write operations, when the bit line selecting signal /SBTL turns to high level, the memory cell array ALY on the right in the diagram is connected to the sense amplifier SA. When the bit line selecting signal /SBTR turns to high level, the memory cell array ALY on the right in the diagram is connected to the sense amplifier SA. Any one of the eight bit line selecting signals /SBTL and /SBTR supplied to the four memory blocks BLK turns to high level in accordance with the row address RADD.

The precharging circuit 30 has two nMOS transistors connected in series between the bit lines BL and /BL. When the bit line resetting signal /BRS is at high level, the precharging circuit 30 operates to supply a precharging voltage VPR to the bit lines BL and /BL.

The latch 32 is composed of two CMOS inverters having inputs and outputs connected to each other. The sources of the pMOS transistors of the CMOS inverters are supplied with the first activating signal PSA. The sources of the nMOS transistors are supplied with the first activating signal NSA. When the first activating signals PSA and NSA are at high level and low level, respectively, the latch 32 is activated to amplify the voltage difference between the bit lines BL and /BL and latch the logic level amplified.

Figure 2:
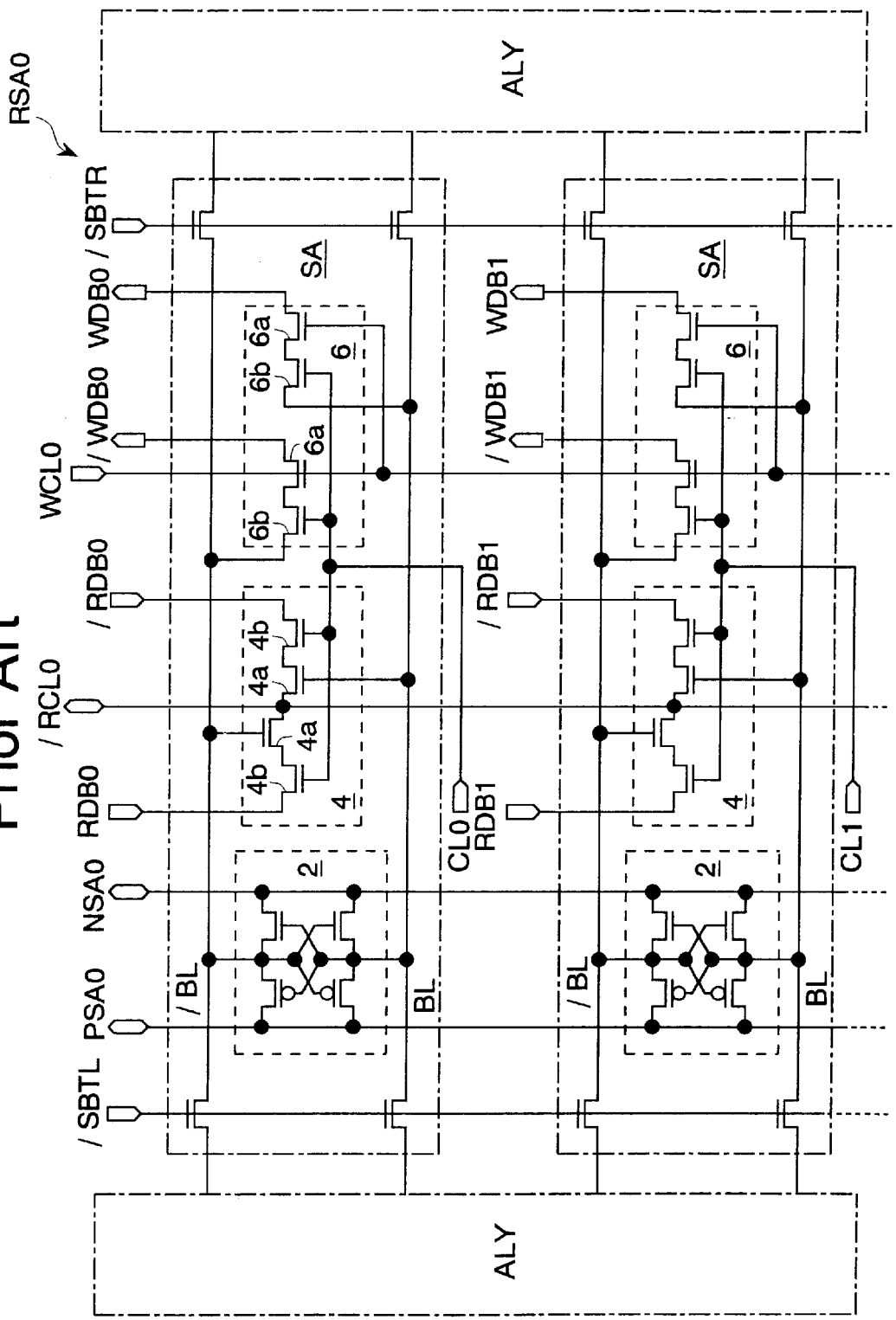
FIG. 2 is a circuit diagram showing an overview of the sense amplifier arrays of FIG. 1.

The read control circuit 34 is almost the same circuit as the read control circuit 4 of FIG. 2. That is, the semiconductor memory of the present invention adopts the direct sense system. The read control circuit 34 has an amplifying transistor 34a and a switching transistor 34b (column switch) for each bit line BL, /BL. The amplifying transistor 34a is connected at its gate to the bit line BL (or /BL) and at its source to the second activating signal line /RCL (/RCL0–1). The switching transistor 34b is connected at its source to the drain of the amplifying transistor 34a, at its gate to the column selecting signal line CL (CL0–1), and at its drain to a read data bus line RDB (RDB0–2) or /RDB (/RDB0–2).

The write control circuit 36 is almost the same circuit as the write control circuit 6 of FIG. 2. That is, it has two switching transistors 36a and 36b connected in series for each bit line BL, /BL. The switching transistor 36a is connected at one end to a write data bus line WDB (WDB0–2) or /WDB (/WDB0–2). The switching transistor 36b (column switch) is connected at one end to the bit line BL (or /BL). The two gates of the switching transistors 36a and 36b are connected to the third activating signal line WCL0 and the column selecting signal line CL (CL0–1), respectively.

The memory cell arrays ALY have a plurality of memory cells MC. Each of the memory cells MC consists of a capacitor for retaining data and a transfer transistor for connecting this capacitor to a bit line BL (or /BL). The gate of the transfer transistor is connected to a word line WL (WL0–1).

In this embodiment, 2-bit data is input/output to/from the memory core M through each data input/output terminal in read operations and write operations. On this account, the column selecting lines CL are laid common to two sense amplifiers SA each.

Figure 7:
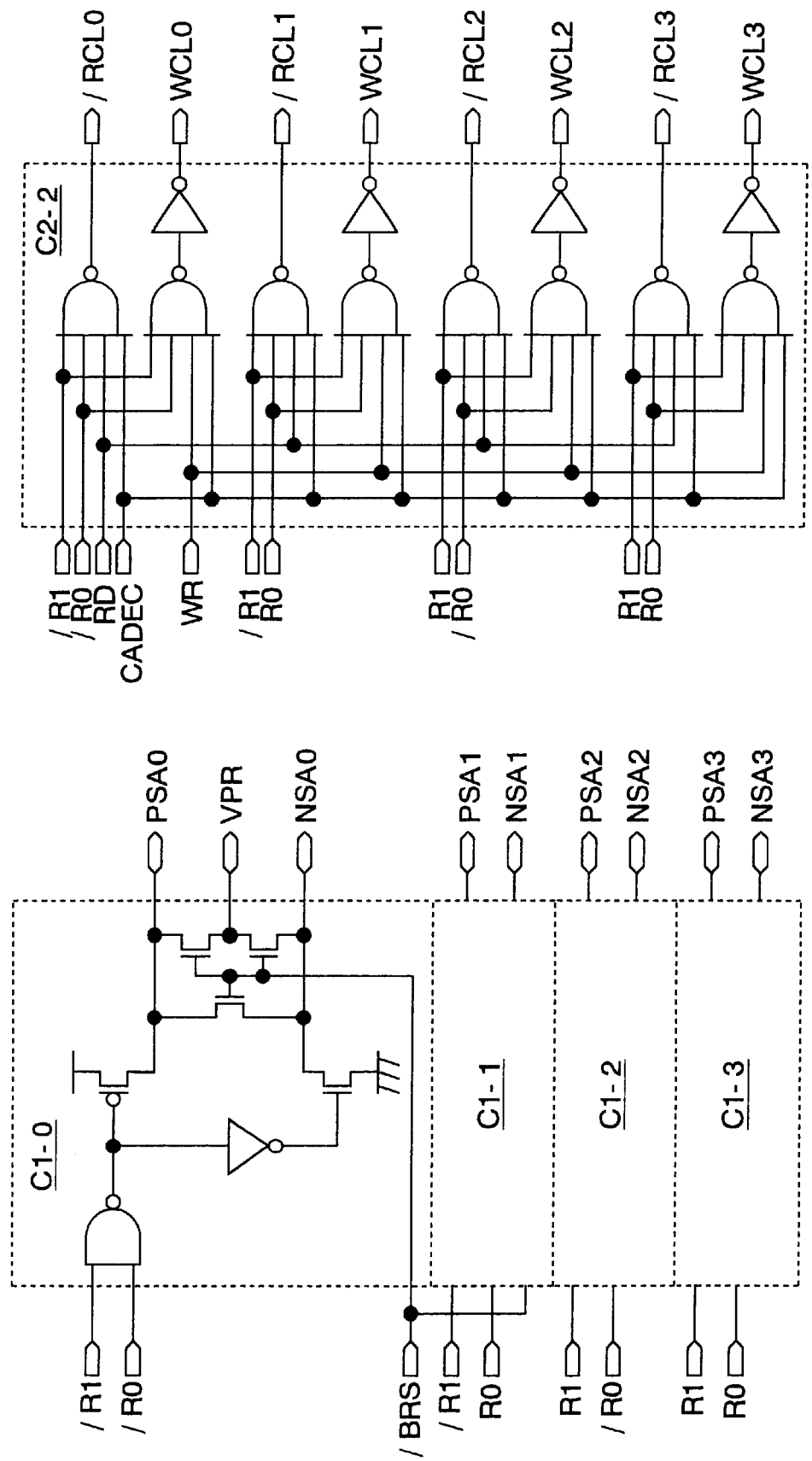
FIG. 7 is a circuit diagram showing the details of the first and second sense amplifier circuits of FIG. 4.

FIG. 7 shows the details of the first sense amplifier control circuits C1 (C1-0, C1-1, C1-2, C1-3) and the second sense amplifier control circuit C2-2 of FIG. 4. The second sense amplifier control circuits C2-0, C2-1, and C2-3 have the same configuration as that of the second sense amplifier control circuit C2-2 except that different column addresses CADD are input thereto. Thus, description thereof will be omitted here.

The first sense amplifier control circuit C1-0 has a pMOS transistor for connecting a sense amplifier activating line PSA to a high voltage line, an nMOS transistor for connecting a sense amplifier activating line NSA to a low voltage line, a logic gate for controlling the pMOS transistor and the nMOS transistor in accordance with the row address R1, R0, and a plurality of nMOS transistors to be controlled by the bit line resetting signal /BRS to connect the sense amplifier activating lines PSA and NSA to each other.

The first sense amplifier control circuits C1-1, C1-2, and C1-3 have the same configuration as that of the second sense amplifier control circuit C1-0 except that different row addresses are input thereto. For example, when the row address R1, R0 is "00", the first sense amplifier control circuit C1-0 operates alone, connecting the sense amplifier activating lines PSA0 and NSA0 to the high voltage line and the low voltage line, respectively. The other sense amplifier activating signals PSA and NSA are kept precharged.

The second sense amplifier control circuit C2-2 has NAND gates for activating the second activating signals /RCL0–3 in accordance with the row address R1, R0, the read control signal RD, and a decoding signal CADEC of the column address CADD, and AND circuits for activating the third activating signals WCL0–3 in accordance with the row address R1, R0, the write control signal WR, and the decoding signal CADEC. The decoding signal CADEC is generated from the upper two bits of the column address signal CADD. Here, the circuitry for generating the third activating signals WCL0–3 operates as a third sense amplifier control circuit.

In the shown second sense amplifier control circuit C2-2, the decoding signal CADEC turns to high level when the upper two bits of the column address CADD are "10". For example, when the row address R1, R0 is "01" and the upper two bits of the column address CADD are "10", the second activating signal /RCL2 and the third activating signal WCL2 are activated. This operates the read control circuits 34 and the write control circuits 36 in the sense amplifier array RSA12 which is shown shaded in FIG. 5.

Figure 8:
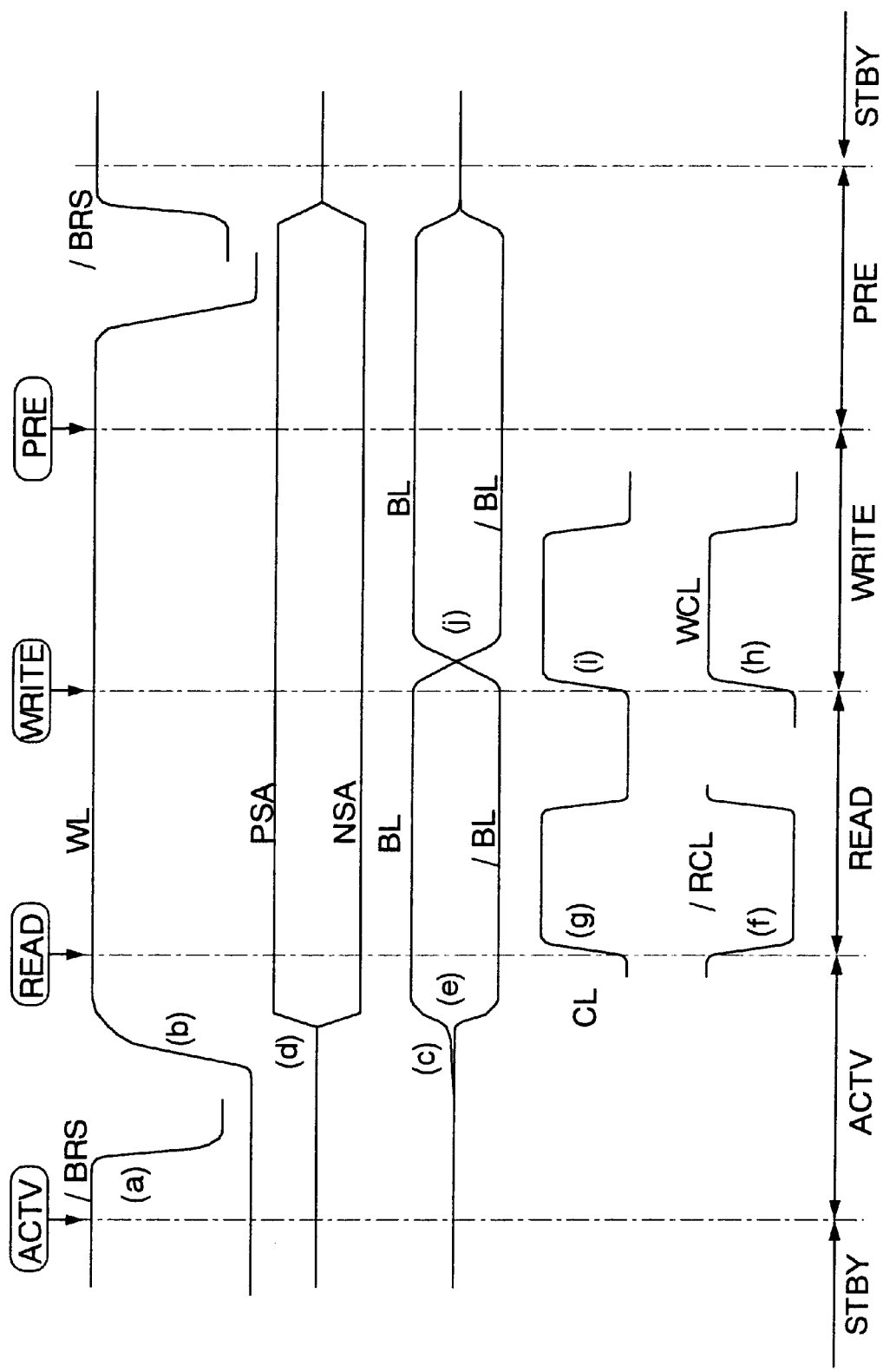
FIG. 8 is a timing chart showing the operations of the low power memory of the present invention.

FIG. 8 shows the operations of the semiconductor memory described above. Detailed description will be omitted of the same operations as those of FIG. 3.

Initially, an active command ACTV and a row address RADD are supplied. The bit line resetting signal /BRS turns to low level, releasing the precharge of the bit line pairs BL, /BL (FIG. 8(a)). The bit line resetting signals /BRS, /SBRSL, and /SBRSR, and the bit line selecting signals /SBTL and /SBTR are activated by a sense amplifier control circuit which is not shown in FIG. 5.

The row decoder RDEC of FIG. 4 activates a word line WL in accordance with the row address RADD (FIG. 8(b)). Due to the activation of the word line WL, data is read from the memory cells MC to the bit lines BL (or /BL) (FIG. 8(c)).

Next, the first sense amplifier control circuits C1 activate the first activating signals PSA and NSA of a memory block BLK corresponding to the row address RADD (FIG. 8(d)). By the activation of the sense amplifier activating signals PSA and NSA, all the latches 32 in the memory block BLK are activated to start their amplifying operations. Due to the activation of the latches 32, the voltage differences between the bit lines BL and /BL are amplified (FIG. 8(e)). At this point, the second activating signals /RCL and the third activating signals WCL are yet to be activated.

Next, a read command READ and a column address CADD are supplied. The second sense amplifier control circuits C2 activate the second activating signal /RCL that corresponds to a sense amplifier array RSA according to the row address RADD supplied in advance and the column address CADD (FIG. 8(f)). The activation of the second activating signal /RCL activates the amplifying transistors 34a of FIG. 6, amplifying the read data on the bit lines BL and /BL. In this operating cycle, the write control signal WR will not be activated. Therefore, the AND circuits in the second sense amplifier control circuit C2-2 of FIG. 7 make no operation, activating none of the third activating signals WCL. Consequently, the read operation involves no unnecessary circuit in operation, with a reduction in power consumption.

Now, the column decoder CDEC of FIG. 4 activates any one of the column selecting signals CL in accordance with the column address CADD (FIG. 8(g)). The activation of the column selecting signal CL turns on the switching transistors 34b of the read control circuits 34, whereby the complementary read data amplified by the amplifying transistors 34a is read out to the read data bus lines RDB and /RDB.

Next, a write command WRITE, a column address CADD, and write data are supplied. The second sense amplifier control circuits C2 activate the third activating signal WCL that corresponds to a sense amplifier array RSA according to the row address RADD supplied in advance and the column address CADD (FIG. 8(h)). The activation of the third activating signal WCL turns on the switching transistors 36a in the write control circuits 36 of FIG. 6. In this operating cycle, the read control signal RD will not be activated. Therefore, the NAND gates in the second sense amplifier control circuit C2-2 of FIG. 7 make no operation, activating none of the second activating signal lines /RCL. Consequently, the write operation involves no unnecessary circuit in operation, with a reduction in power consumption.

Now, the column decoder CDEC activates any one of the column selecting signals CL in accordance with the column address CADD (FIG. 8(i)). The activation of the column selecting signal CL turns on the switching transistors 36b in the write control circuits 36, thereby transmitting the complementary write data on the write data bus lines WDB and /WDB to the bit lines BL and /BL (FIG. 8(j)). The write data is amplified by the latches 32 of the sense amplifiers SA and written to the memory cells MC.

Figure 3:
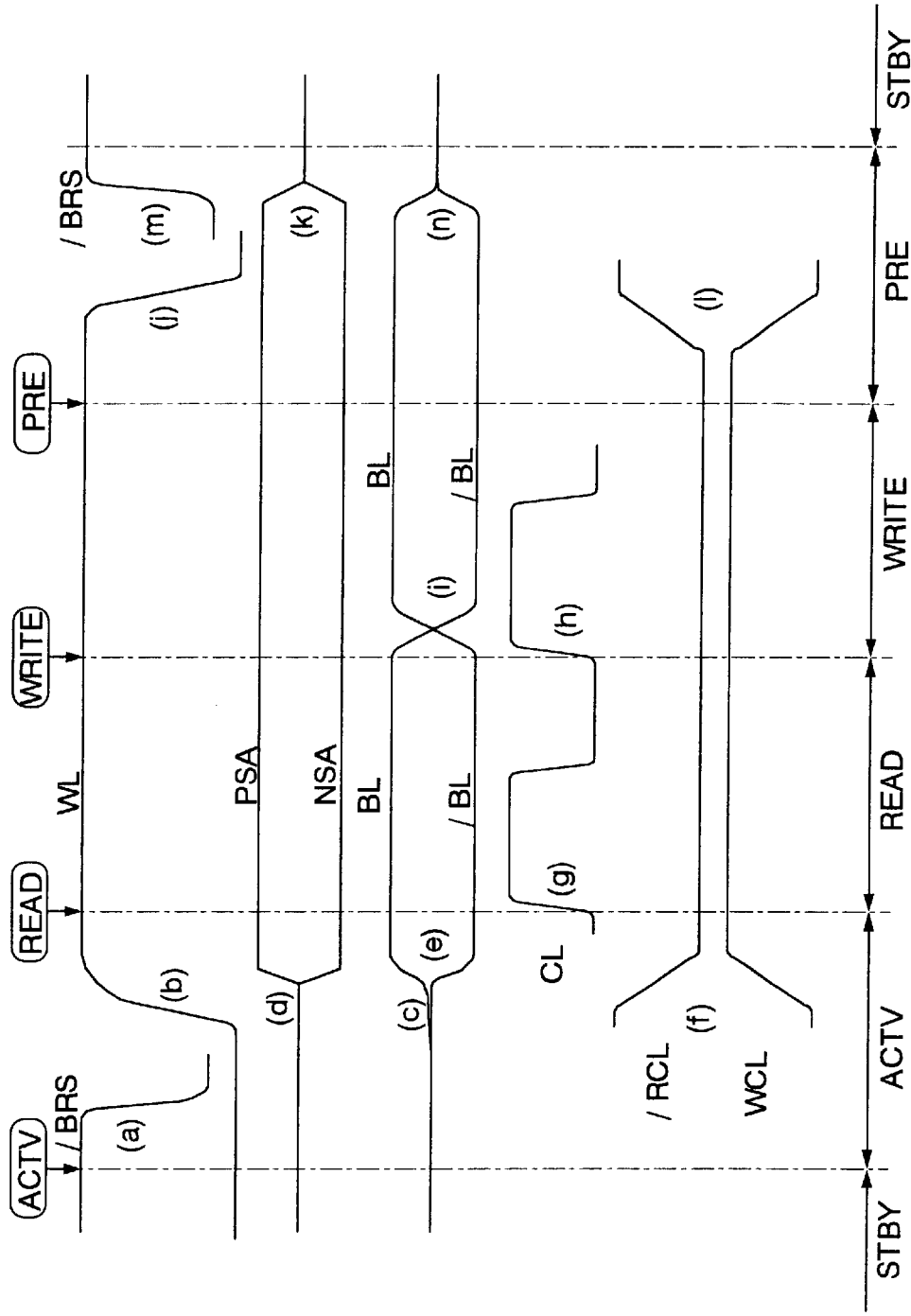
FIG. 3 is a timing chart showing the operations of the conventional DRAM.

Subsequently, as in FIG. 3, a precharging command PRE is supplied and the semiconductor memory enters a standby state STBY.

As has been described, according to the present embodiment, the amplifying transistors 34a of the sense amplifiers SA are activated in units of sense amplifier arrays RSA by means of the plurality of second activating signals /RCL. Therefore, the number of amplifying transistors 34a to operate can be reduced to lower the power consumption in read operations. The wiring lengths of the second activating signal lines /RCL can be made shorter than heretofore, with a reduction in the loads of the signal lines. It is therefore possible to lower the driving capacity of the NAND gates (buffer circuits) of the second sense amplifier control circuits C2 that generate the second activating signals /RCL. As a result, the power consumption of the sense amplifiers SA can be reduced significantly in read operations. Even if a plurality of memory blocks BLK is arranged along the second direction, the power consumption in read operations can be reduced greatly.

The smaller loads of the second activating signal lines /RCL can shorten the transmission time of the second activating signals /RCL. This allows a reduction in read operating time.

The second sense amplifier control circuits C2 generate the second activating signals from the logic of the column address. This facilitates dividing the regions of the sense amplifiers SA along the first direction, or the direction of arrangement of the bit lines BL and /BL, to constitute the plurality of sense amplifier arrays RSA.

Since the second sense amplifier control circuits C2 are arranged corresponding to the sense amplifier arrays RSA in the first direction, the second activating signal lines /RCL can be minimized in wiring length. In addition, the wiring lengths of the second activating signal lines /RCL can be made identical for all the sense amplifier arrays RSA. This results in a further reduction in the transmission time of the second activating signals /RCL.

The second sense amplifier control circuits C2 are arranged along the column decoder CDEC. Therefore, the signal lines of the column address supplied to the second amplifier control circuits C2 can be minimized in wiring length.

The second activating signal lines /RCL and the third activating signal lines WCL are laid in the same first wiring layer of low resistance as the column selecting signal lines CL for controlling the column switches 34b are. This allows a further reduction in the transmission time of the second activating signals /RCL and the third activating signals WCL.

The second activating signal lines /RCL and the third activating signal lines WCL are laid in the first wiring layer as far as the sense amplifier arrays RSA, and laid in the same second wiring layer as that of the first activating lines PSA and NSA within the sense amplifier arrays RSA. Since the relatively long wiring up to the sense amplifier arrays RSA is formed in the first wiring layer of low resistance, it is possible to lower the wiring resistance of the second activating signal lines /RCL and the third activating signal lines WCL.

The switching transistors 36a of the sense amplifiers SA are activated in units of sense amplifier arrays RSA by means of the plurality of third activating signals WCL. Therefore, the number of switching transistors 36a to operate can be reduced to lower the power consumption in write operations. The wiring lengths of the third activating signal lines WCL can be made shorter than heretofore, with a reduction the loads of the signal lines. It is therefore possible to lower the driving capacity of the AND circuits (buffer circuits, third sense amplifier control circuits) of the second sense amplifier control circuits C2 that generate the third activating signals WCL. As a result, the power consumption of the sense amplifiers SA can be reduced significantly in write operations. Even if a plurality of memory blocks BLK is arranged along the second direction, the power consumption in write operations can reduced greatly.

The smaller loads of the third activating signal lines WCL can shorten the transmission time of the third activating signals WCL. This allows a reduction in write operating time.

The second sense amplifier control circuits C2 generate the second activating signals /RCL alone in read operations, and the third activating signals WCL alone in write operations. Since read operations and write operations involve only the respective necessary control circuits in operation, which allows a reduction in power consumption.

The foregoing embodiment has dealt with the case where the present invention is applied to a semiconductor memory having a DRAM core. However, the present invention is not limited to such an embodiment. For example, the present invention may be applied to an SDRAM (Synchronous DRAM) or an FCRAM (Fast Cycle RAM) having a DRAM core.

The foregoing embodiment has dealt with the case where the present invention is applied to a clock asynchronous semiconductor memory. However, the present invention is not limited to such an embodiment. For example, the present invention may be applied to a clock synchronous semiconductor memory.

The foregoing embodiment has dealt with the case where the present invention is applied to a semiconductor memory of address multiplex system. However, the present invention is not limited to such an embodiment. For example, the present invention may be applied to a semiconductor memory of address nonmultiplex system.

The foregoing embodiment has dealt with the case where the present invention is applied to a semiconductor memory having one single memory core M. However, the present invention is not limited to such an embodiment. For example, the present invention may be applied to a semiconductor memory having a plurality of memory cores (banks) that operate independently.

The foregoing embodiment has dealt with the case where the sense amplifiers SA in a memory block BLK are divided into four sense amplifier arrays RSA. However, the present invention is not limited to such an embodiment. An increase in the number of sense amplifier arrays RSA makes the wiring loads of the second activating signal lines /RCL and the third activating signal lines WCL smaller, allowing a reduction in the driving capacity of the second sense amplifier control circuits C2. Thus, the greater the number of sense amplifier arrays RSA, the further the operating power consumption can be reduced.

The invention is not limited to the above embodiments and various modifications may be made without departing from the spirit and scope of the invention. Any improvement may be made in part or all of the components.

What is claimed is:

1. A semiconductor memory comprising:
    a memory cell array having a plurality of memory cells and a plurality of bit lines for transmitting data to said memory cells, respectively;
    a plurality of sense amplifier arrays each including a plurality of sense amplifiers for amplifying respective data on said bit lines;
    a first sense amplifier control circuit for generating a first activating signal to be supplied to said sense amplifiers in all of said sense amplifier arrays simultaneously; and
    a plurality of second sense amplifier control circuits for generating second activating signals having different activating timings from each other and being supplied to said sense amplifier arrays, respectively, wherein said sense amplifiers each include:
        a latch for amplifying and holding data on corresponding bit line of said bit lines in response to the activation of said first activating signal;
        an amplifying transistor configured separately from said latch, for amplifying a voltage level of said bit line received at a gate of said amplifying transistor upon receiving the activation of one of said second activating signals at a source of said amplifying transistor; and
        a first column switch for connecting the drain of said amplifying transistor to a read data bus line in response to the activation of a column selecting signal.

2. The semiconductor memory according to claim 1, comprising:
    word lines for controlling connection between storage nodes of said memory cells and said bit lines; and
    an address input circuit for receiving a row address for selecting one of said word lines and a column address for selecting one of said column switches, wherein:
        said first sense amplifier control circuit activates said first activating signal in accordance with said row address; and
        said second sense amplifier control circuits activate said second activating signals in accordance with said row address and said column address, respectively.

3. The semiconductor memory according to claim 2, wherein
    said address input circuit receives said row address and said column address in time division.

4. The semiconductor memory according to claim 2, comprising
    a plurality of memory blocks to be selected in accordance with said row address, respectively, each having said memory cell array and a plurality of said sense amplifier arrays arranged in a first direction along said memory cell array.

5. The semiconductor memory according to claim 4, wherein:
    said memory blocks are arranged in a second direction orthogonal to the first direction;
    said first sense amplifier control circuit is arranged at one end of each of said respective memory blocks along the second direction; and
    said second sense amplifier control circuits are arranged outside said memory blocks corresponding to said sense amplifier arrays respectively, along the first direction.

6. The semiconductor memory according to claim 5, comprising
    second activating signal lines for transmitting said second activating signals to said sense amplifier arrays, wherein
        said second activating signal lines are laid in the same second direction as that of signal lines of said column selecting signals for controlling said column switches.

7. The semiconductor memory according to claim 5, further comprising
    second activating signal lines for transmitting said second activating signals to said sense amplifiers, wherein
        said second activating signal lines are laid in a first wiring layer, in which signal lines of said column selecting signals for controlling said column switches are laid, said second activating signal lines extending as far as said sense amplifier arrays.

8. The semiconductor memory according to claim 7, wherein said second activating signal lines are laid as far as said sense amplifier arrays in the second direction in a first wiring layer and laid in the first direction in a second wiring layer within said sense amplifier arrays, in which
the first wiring layer includes the signal lines of said column selecting signals, and
the second wiring layer includes first activating signal lines for transmitting said first activating signals to said sense amplifiers.

9. The semiconductor memory according to claim 1, further comprising
second activating signal lines for transmitting said second activating signals to said sense amplifier arrays, wherein
said second activating signal lines are laid in a first wiring layer, in which signal lines of said column selecting signals for controlling said column switches are laid.

10. The semiconductor memory according to claim 9, wherein
said second activating signal lines are laid in a direction orthogonal to a first activating signal line for transmitting said first activating signal to said sense amplifiers.

11. The semiconductor memory according to claim 1, wherein:
said sense amplifier arrays are arranged in a first direction along said memory cell array; and
said second activating signals are transmitted to said sense amplifiers through second activating signal lines, wherein
said second activating signal lines are laid in a second direction orthogonal to the first direction in a first wiring layer as far as said sense amplifier arrays, and laid in the first direction in a second wiring layer within said sense amplifier arrays, in which
the first wiring layer includes signal lines for controlling said column switches, and
the second wiring layer includes a first activating signal line for transmitting said first activating signal.

12. The semiconductor memory according to claim 1, comprising
a plurality of third sense amplifier control circuits for generating third activating signals having different activating timings from each other and being supplied to said sense amplifier arrays, respectively, wherein
said sense amplifiers each include:
a switch to turn on in response to the activation of one of said third activating signals to transmit the data on corresponding bit line of said bit lines; and
a second column switch for connecting said bit line to a write data bus line through said switch in response to the activation of said column selecting signal.

13. The semiconductor memory according to claim 12, wherein:
said second sense amplifier control circuits generate said second activating signals in read operations; and
said third sense amplifier control circuits generate said third activating signals in write operations.

14. The semiconductor memory according to claim 12, wherein:
said sense amplifier arrays are arranged in a first direction along said memory cell array; and
said third activating signals are transmitted to said sense amplifiers through third activating signal lines, wherein
said third activating signal lines are laid in a second direction orthogonal to the first direction in a first wiring layer as far as said sense amplifier arrays, and laid in the first direction in a second wiring layer within said sense amplifier arrays, in which
the first wiring layer includes signal lines for controlling said column switches, and
the second wiring layer includes a first activating signal line for transmitting said first activating signal.

15. The semiconductor memory according to claim 12, further comprising
third activating signal lines for transmitting said third activating signals to said sense amplifier arrays, wherein
said third activating signal lines are laid in a first wiring layer, in which signal lines of said column selecting, for controlling aid second column switches are laid.

16. The semiconductor memory according to claim 15, wherein
said third activating signal lines are laid in a direction orthogonal to a first activating signal line for transmitting said first activating signal to said sense amplifiers.

17. The semiconductor memory according to claim 1, wherein;
said sense amplifier arrays are arranged along said memory cell array; and
said sense amplifiers are lined in a row along said memory cell array.

18. A semiconductor memory, comprising:
a memory cell array, having memory cells and bit lines transmitting data to/from said memory cells;
a sense amplifier block, disposed along the memory cell array, including a plurality of sense amplifier arrays;
data bus lines;
a plurality of first activating signal segment lines, each extending along a corresponding sense amplifier array of said sense amplifier arrays, for transmitting data on said bit lines to said data bus lines in a read operation;
a plurality of second activating signal segment lines, each extending along said corresponding sense amplifier array, for transmitting data on said data bus lines to said bit lines in a write operation;
a plurality of third activating signal segment lines, each extending perpendicularly in a direction to where said sense amplifier block extends, for supplying first activating signals to said first activating signal segment lines, respectively; and
a plurality of fourth activating signal segment lines, each extending in parallel with the third activating signal segment lines, for supplying second activating signals to said second activating signal segment lines, respectively.

19. The semiconductor memory according to claim 18, further comprising
a plurality of column selection lines for coupling selected bit lines of said bit lines to the data bus lines, wherein said column selection lines extend in parallel with said third and fourth activating signal segment lines.

* * * * *